United States Patent
Jeon et al.

(10) Patent No.: US 8,373,174 B2
(45) Date of Patent: Feb. 12, 2013

(54) III-NITRIDE SEMICONDUCTOR LIGHT EMITTING DEVICE

(75) Inventors: Soo Kun Jeon, Gyeonggi-do (KR); Eun Hyun Park, Gyeonggi-do (KR); Jun Chun Park, Gyeonggi-do (KR)

(73) Assignee: Semicon Light Co., LTD, Gyeonggi-Do (KR)

( * ) Notice: Subject to any disclaimer, the term of this patent is extended or adjusted under 35 U.S.C. 154(b) by 78 days.

(21) Appl. No.: 12/748,540

(22) Filed: Mar. 29, 2010

(65) Prior Publication Data
US 2011/0073870 A1    Mar. 31, 2011

(30) Foreign Application Priority Data
Sep. 30, 2009    (KR) .................. 10-2009-0092912

(51) Int. Cl.
*H01L 29/15* (2006.01)
*H01L 31/0256* (2006.01)
*H01L 33/00* (2010.01)

(52) U.S. Cl. .............. 257/76; 257/103; 257/E33.025; 257/E33.032

(58) Field of Classification Search ................ None
See application file for complete search history.

(56) References Cited

U.S. PATENT DOCUMENTS

| | | | |
|---|---|---|---|
| 3,739,241 | A | 6/1973 | Thillays |
| 5,122,845 | A | 6/1992 | Manabe et al. |
| 5,247,533 | A | 9/1993 | Okazaki et al. |
| 5,290,393 | A | 3/1994 | Nakamura |
| 5,306,662 | A | 4/1994 | Nakamura et al. |
| 5,563,422 | A | 10/1996 | Nakamura et al. |
| 5,733,796 | A | 3/1998 | Manabe et al. |
| 6,194,743 | B1 | 2/2001 | Kondoh et al. |
| 6,515,306 | B2 | 2/2003 | Kuo et al. |
| 2006/0154454 | A1 | 7/2006 | Jeon et al. |
| 2006/0157714 | A1 | 7/2006 | Yoo et al. |
| 2009/0039373 | A1 | 2/2009 | Saito et al. |
| 2009/0085054 | A1* | 4/2009 | Jeon et al. ............. 257/101 |

FOREIGN PATENT DOCUMENTS
JP    2007-180495    7/2007

* cited by examiner

*Primary Examiner* — Fernando L Toledo
*Assistant Examiner* — Valerie N Newton
(74) *Attorney, Agent, or Firm* — Samuel Digirolamo; Husch Blackwell LLP (57) ABSTRACT

The present III-nitride semiconductor light-emitting device comprises: a first III-nitride semiconductor layer having a first conductivity type; a second III-nitride semiconductor layer having a second conductivity type different from the first conductivity type; an active layer disposed between the first III-nitride semiconductor layer and the second III-nitride semiconductor layer and generating light by recombination of electrons and holes; and a depletion barrier layer brought into contact with the active layer and having a first conductivity type.

13 Claims, 8 Drawing Sheets

FIG. 1

Prior Art

FIG. 2

Prior Art

III-NITRIDE SEMICONDUCTOR LIGHT EMITTING DEVICE

CROSS REFERENCE

This application claims priority under 35 U.S.C. §119 to Korean Patent Application No. 2009-92912, filed on Sep. 30, 2009 in the Korean Intellectual Property Office (KIPO), the disclosure of which application is incorporated herein by reference in its entirety.

BACKGROUND OF INVENTION

The present invention relates generally to a III-nitride semiconductor light-emitting device, and, more particularly, to a III-nitride semiconductor light-emitting device in which a structure for protecting the light-emitting device from electrostatic discharge (ESD) is provided.

The III-nitride semiconductor light-emitting device means a light-emitting device such as a light-emitting diode including a compound semiconductor layer composed of Al(x)Ga(y)In(1−x−y)N ($0 \leq x \leq 1$, $0 \leq y \leq 1$, $0 \leq x+y \leq 1$), and may further include a material composed of other group elements, such as SiC, SiN, SiCN and CN, and a semiconductor layer made of such materials.

This section provides background information related to the present disclosure which is not necessarily prior art.

Figure 1:
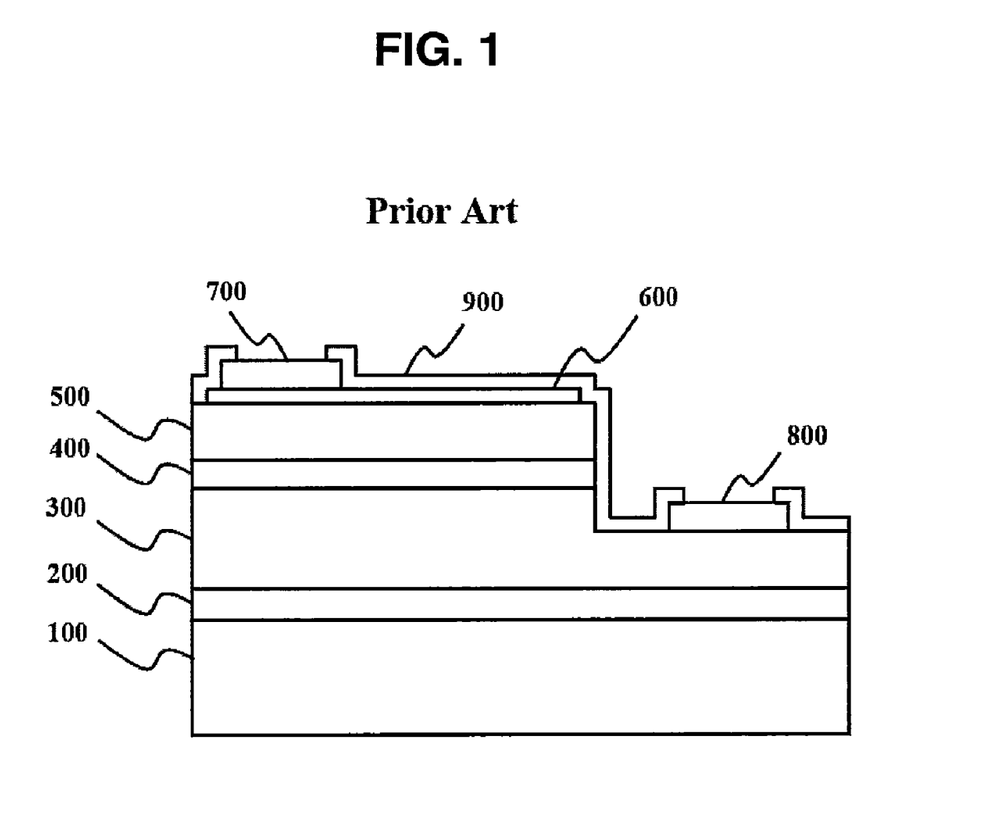
FIG. 1 is a cross-sectional view schematically illustrating structure of a conventional III-nitride semiconductor light-emitting device.

FIG. 1 is a view of an example of a conventional III-nitride semiconductor light-emitting device. The III-nitride semiconductor light-emitting device includes a substrate 100, a buffer layer 200 grown on the substrate 100, an n-type III-nitride semiconductor layer 300 grown on the buffer layer 200, an active layer 400 grown on the n-type III-nitride semiconductor layer 300, a p-type III-nitride semiconductor layer 500 grown on the active layer 400, a p-side electrode 600 formed on the p-type III-nitride semiconductor layer 500, a p-side bonding pad 700 formed on the p-side electrode 600, an n-side electrode 800 formed on the n-type III-nitride semiconductor layer 300 exposed by mesa-etching the p-type III-nitride semiconductor layer 500 and the active layer 400, and a protection film 900.

In the case of the substrate 100, a GaN substrate can be used as a homo-substrate. A sapphire substrate, a SiC substrate or a Si substrate can be used as a hetero-substrate. However, any type of substrate that can have a nitride semiconductor layer grown thereon can be employed. In the case that the SiC substrate is used, the n-side electrode 800 can be formed on the surface of the SiC substrate.

The nitride semiconductor layers epitaxially grown on the substrate 100 are usually grown by metal organic chemical vapor deposition (MOCVD).

The buffer layer 200 serves to overcome differences in lattice constant and thermal expansion coefficient between the hetero-substrate 100 and the nitride semiconductor layers. U.S. Pat. No. 5,122,845 describes a technique of growing an AlN buffer layer with a thickness of 100 to 500 Å on a sapphire substrate at 380 to 800° C. In addition, U.S. Pat. No. 5,290,393 describes a technique of growing an Al(x)Ga(1−x)N ($0 \leq x < 1$) buffer layer with a thickness of 10 to 5000 Å on a sapphire substrate at 200 to 900° C. Moreover, U.S. Publication No. 2006/154454 describes a technique of growing a SiC buffer layer (seed layer) at 600 to 990° C., and growing an In(x)Ga(1−x)N ($0 < x \leq 1$) thereon. In particular, it is provided with an undoped GaN layer with a thickness of 1 micron to several microns (μm) on the AN buffer layer, the Al(x)Ga(1−x)N ($0 \leq x < 1$) buffer layer or the SiC/In(x)Ga(1−x)N ($0 < x \leq 1$) layer.

In the n-type nitride semiconductor layer 300, at least the n-side electrode 800 formed region (n-type contact layer) is doped with a dopant. In some embodiments, the n-type contact layer is made of GaN and doped with Si. U.S. Pat. No. 5,733,796 describes a technique of doping an n-type contact layer at a target doping concentration by adjusting the mixture ratio of Si and other source materials.

The active layer 400 generates light quanta by recombination of electrons and holes. For example, the active layer 400 contains In(x)Ga(1−x)N ($0 < x \leq 1$) and has a single layer or multi-quantum well layers.

The p-type nitride semiconductor layer 500 is doped with an appropriate dopant such as Mg, and has p-type conductivity by an activation process. U.S. Pat. No. 5,247,533 describes a technique of activating a p-type nitride semiconductor layer by electron beam irradiation. Moreover, U.S. Pat. No. 5,306,662 describes a technique of activating a p-type nitride semiconductor layer by annealing over 400° C. U.S. Publication No. 2006/157714 describes a technique of endowing a p-type nitride semiconductor layer with p-type conductivity without an activation process, by using ammonia and a hydrazine-based source material together as a nitrogen precursor for growing the p-type nitride semiconductor layer.

The p-side electrode 600 is provided to facilitate current supply to the p-type nitride semiconductor layer 500. U.S. Pat. No. 5,563,422 discloses a technique associated with a light transmitting electrode composed of Ni and Au formed over almost the entire surface of the p-type nitride semiconductor layer 500 and in ohmic-contact with the p-type nitride semiconductor layer 500. In addition, U.S. Pat. No. 6,515,306 describes a technique of forming an n-type superlattice layer on a p-type nitride semiconductor layer, and forming a light-transmitting electrode made of indium tin oxide (ITO) thereon.

The p-side electrode 600 can be formed so thick as to not transmit but rather to reflect light toward the substrate 100. This technique is called the flip chip technique. U.S. Pat. No. 6,194,743 describes a technique associated with an electrode structure including an Ag layer with a thickness over 20 nm, a diffusion barrier layer covering the Ag layer, and a bonding layer containing Au and Al, and covering the diffusion barrier layer.

The p-side bonding pad 700 and the n-side electrode 800 are provided for current supply and external wire-bonding. U.S. Pat. No. 5,563,422 describes a technique of forming an n-side electrode with Ti and Al.

The optional protection film 900 can be made of SiO2.

The n-type nitride semiconductor layer 300 or the p-type nitride semiconductor layer 500 can be constructed as a single layer or as plural layers. Vertical light-emitting devices are introduced by separating the substrate 100 from the nitride semiconductor layers using a laser technique or wet etching.

Figure 2:
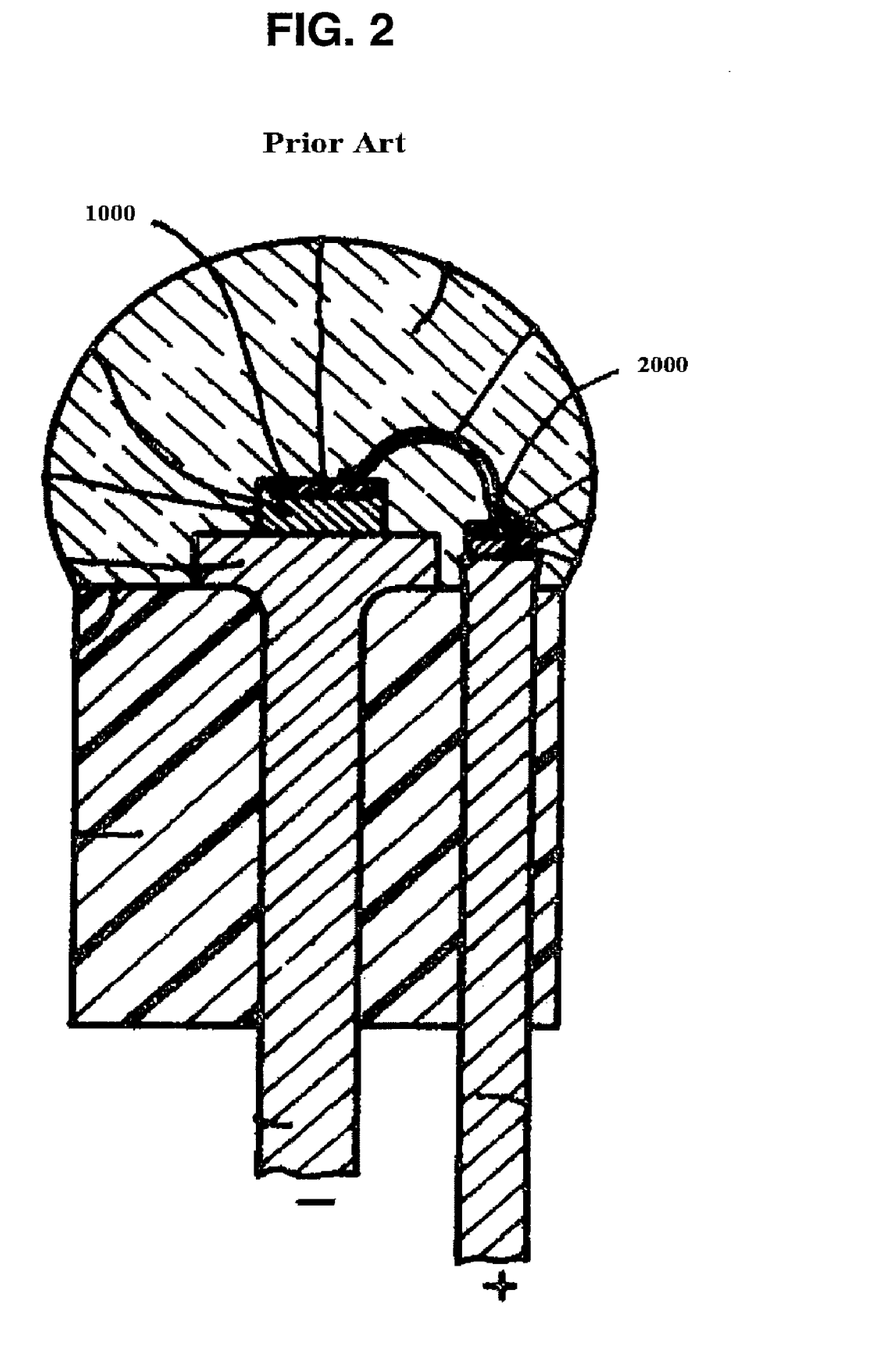
FIG. 2 is a cross-sectional view of an example of a semiconductor light-emitting device package suggested in U.S. Pat. No. 3,739,241.

FIG. 2 is a view of an example of a semiconductor light-emitting device package suggested in U.S. Pat. No. 3,739,241. The semiconductor light-emitting device package includes not only a semiconductor light-emitting device 1000 but also a protection device 2000 for protecting the light-emitting device 1000 from ESD.

The problems to be solved by the present disclosure will be described in the latter part of the best mode for carrying out the invention.

SUMMARY OF INVENTION

This section provides a general summary of the disclosure and is not a comprehensive disclosure of its full scope or all of its features.

According to one aspect of the present disclosure, there is provided a III-nitride semiconductor light-emitting device, including: a first III-nitride semiconductor layer having a first conductivity type; a second III-nitride semiconductor layer having a second conductivity type different from the first conductivity type; an active layer disposed between the first III-nitride semiconductor layer and the second III-nitride semiconductor layer and generating light by recombination of electrons and holes; and a depletion barrier layer brought into contact with the active layer and having a first conductivity type.

The advantageous effects of the present disclosure will be described in the latter part of the best mode for carrying out the invention.

It should be understood that the drawings are not necessarily to scale and that the embodiments disclosed herein are sometimes illustrated by fragmentary views. In certain instances, details which are not necessary for an understanding of the present invention or which render other details difficult to perceive may have been omitted. It should also be understood that the invention is not necessarily limited to the particular embodiments illustrated herein. Like numbers utilized throughout the various figures designate like or similar parts or structure.

DETAILED DESCRIPTION

Hereinafter, the present disclosure will be described in detail with reference to the accompanying drawings.

Figure 3:
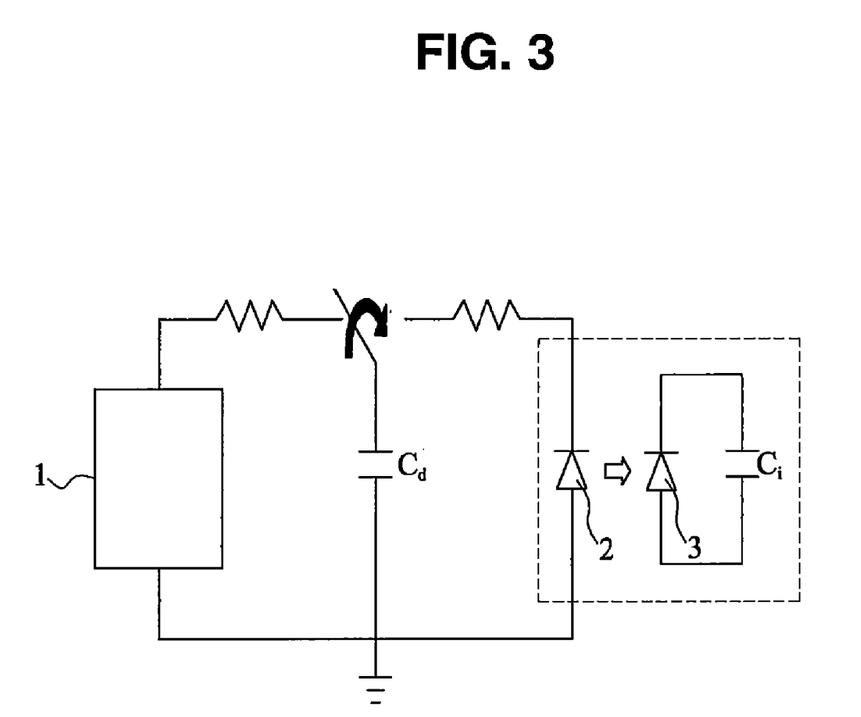
FIG. 3 is a schematic diagram showing the principle in which an ESD protection structure is introduced into the inside of a light-emitting device according to the present disclosure.

FIG. 3 is an explanatory view of the principle in which an electrostatic discharge (ESD) protection structure is introduced into the inside of a light-emitting device according to the present disclosure. The light-emitting device 2 connected to an ESD simulator 1 is shown as an equivalent circuit. The light-emitting device 2 can be represented by an ideal diode 3 and an internal capacitor having internal capacitance Ci. The total capacitance Ct can be expressed as the sum of the internal capacitance Ci and capacitance Cd. Here, the capacitance Cd is discharge capacitance of the ESD simulator 1. The energy dissipated in the light-emitting device 2 is proportional to the power of the quantity of electric charge charged in the ESD simulator 1 and inversely proportional to the total capacitance Ct. Therefore, when the internal capacitance Ci of the light-emitting device 2 is large, the energy dissipated in the light-emitting device 2 in the event of ESD application is reduced, so that the light-emitting device 2 can resist an external shock. In order to increase the internal capacitance Ci of the light-emitting device 2, considered is a method for introducing a p-type III-nitride semiconductor layer and an n-type III-nitride semiconductor layer doped with an n-type dopant, having an active layer interposed therebetween. The present inventors investigated the doping degree of the n-type III-nitride semiconductor layer which could protect the light-emitting device 2 from the ESD under the given active layer and p-type III-nitride semiconductor layer.

Figure 4:
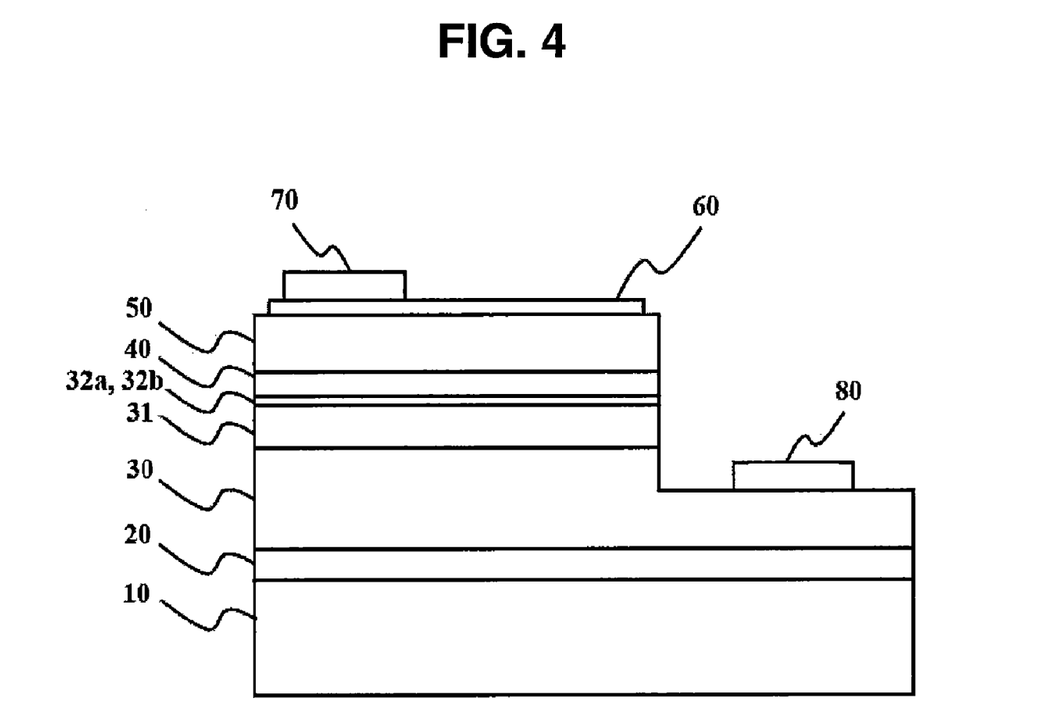
FIG. 4 is a cross-sectional view of a III-nitride semiconductor light-emitting device constructed in accordance with the teachings of the present invention.

FIG. 4 is a view of a III-nitride semiconductor light-emitting device according to the present disclosure, which was used in experiment. The III-nitride semiconductor light-emitting device includes a substrate 10, a buffer layer 20 grown on the substrate 10, an n-type III-nitride semiconductor layer 30 grown on the buffer layer 20, an active layer 40 grown on the n-type III-nitride semiconductor layer 30, a p-type III-nitride semiconductor layer 50 grown on the active layer 40, a p-side electrode 60 formed on the p-type III-nitride semiconductor layer 50, a p-side bonding pad 70 formed on the p-side electrode 60, and an n-side electrode 80 formed on the n-type III-nitride semiconductor layer 30 exposed by mesa-etching the p-type III-nitride semiconductor layer 50 and the active layer 40. Fundamentally, the III-nitride semiconductor light-emitting device has the same structure as the light-emitting device shown in FIG. 1. However, an undoped GaN layer 31 is disposed between the active layer 40 and the n-type III-nitride semiconductor layer 30, and then silicon (Si)-doped GaN layers 32a and 32b are introduced thereon. The GaN layer 32a having a doping concentration of about $3 \times 10^{18-3}$ is prepared as a first sample and the GaN layer 32b having a doping concentration of about $2 \times 10^{19-3}$ is prepared as a second sample. In more detail, the GaN layer 31 having a thickness of 0.2 is formed, the GaN layers 32a and 32b having a thickness of 100 Å are formed thereon, the active layer 40 of the multi-quantum well structure made of InGaN/GaN (well: 20 Å, barrier: 80 Å) is formed thereon, and the p-type III-nitride semiconductor layer 50 having a thickness of 2000 Å and a doping concentration of about $4 \times 10^{19-3}$ and made of GaN is formed thereon.

Here, the GaN layer 31 may be omitted, but is preferably provided to reduce a defect and strain which may occur during the growth of the doped n-type III-nitride semiconductor layer 30. For this purpose, the GaN layer 31 preferably has a thickness of 0.1 to 0.3. If the GaN layer 31 is too thin, it does not normally operate, and if the GaN layer 31 is too thick, it may cause a rise in operating voltage. This layer may be an AlGaN layer or an InGaN layer. In particular, if this layer is an undoped AlGaN layer or InGaN layer, an energy band gap occurs in the bonding boundary between the corresponding layer and the n-type III-nitride semiconductor layer 30 mostly made of GaN, thereby causing a rise in operating voltage. Accordingly, GaN is advantageous.

Figure 5:
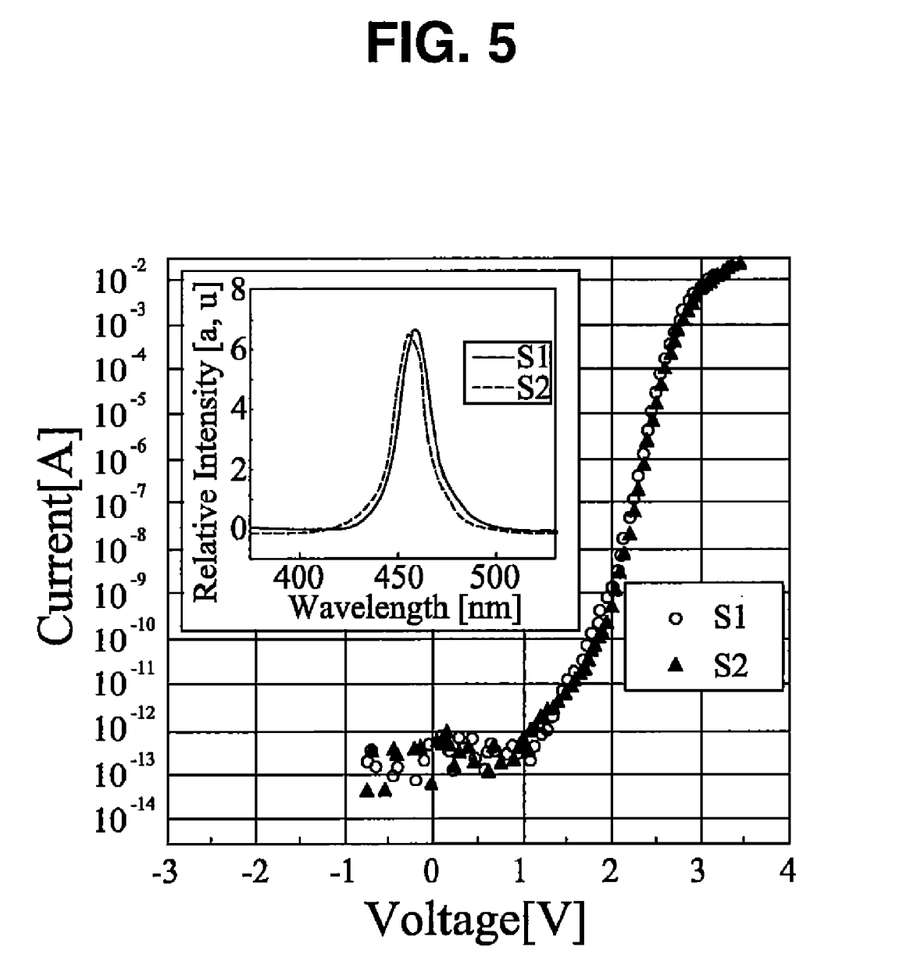
FIG. 5 is a graph of electrical and optical properties of two samples constructed in accordance with the teachings of the present invention.

FIG. 5 is a graph of electrical and optical properties of the two samples according to the present disclosure. S1 denotes the GaN layer 32a and S2 denotes the GaN layer 32b. Referring to FIG. 5, it is determined that the electrical and optical properties of the GaN layers 32a and 32b are not affected by the difference of the n-type dopant concentration.

Figure 6:
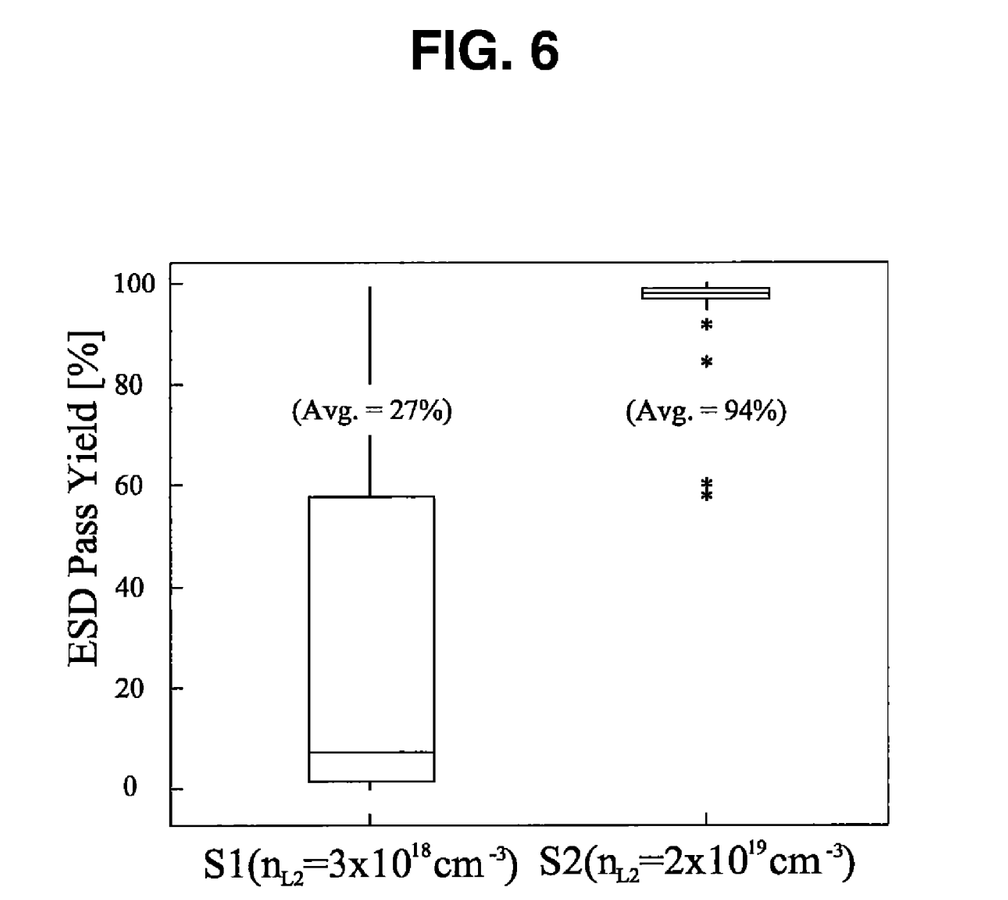
FIG. 6 is a view of ESD property results of the two samples of FIG. 5.

FIG. 6 is a view of ESD property results of the two samples according to the present disclosure, particularly, the yield after the application of 500 V reverse bias to the two samples.

In general, the ESD property can be evaluated using a voltage value at 0.1 before/after the application of reverse constant voltage. For example, in the case of a III-nitride semiconductor light-emitting device having a size of 600×250, if 0.1 of current is applied before the application of reverse constant voltage, the voltage value is about 2.25 V. However, when 0.1 of current is applied after the application of reverse constant voltage, if the III-nitride semiconductor light-emitting device gets damaged, the voltage value is below about 2.1 V. In the case of the GaN layer 32b, if 0.1 of current is applied after the application of 500 V reverse voltage, there is little change in the voltage value. It can be expressed as a yield of 94% on average. However, the GaN layer 32a has a yield of 27% on average and shows large ESD property distribution.

Figure 7:
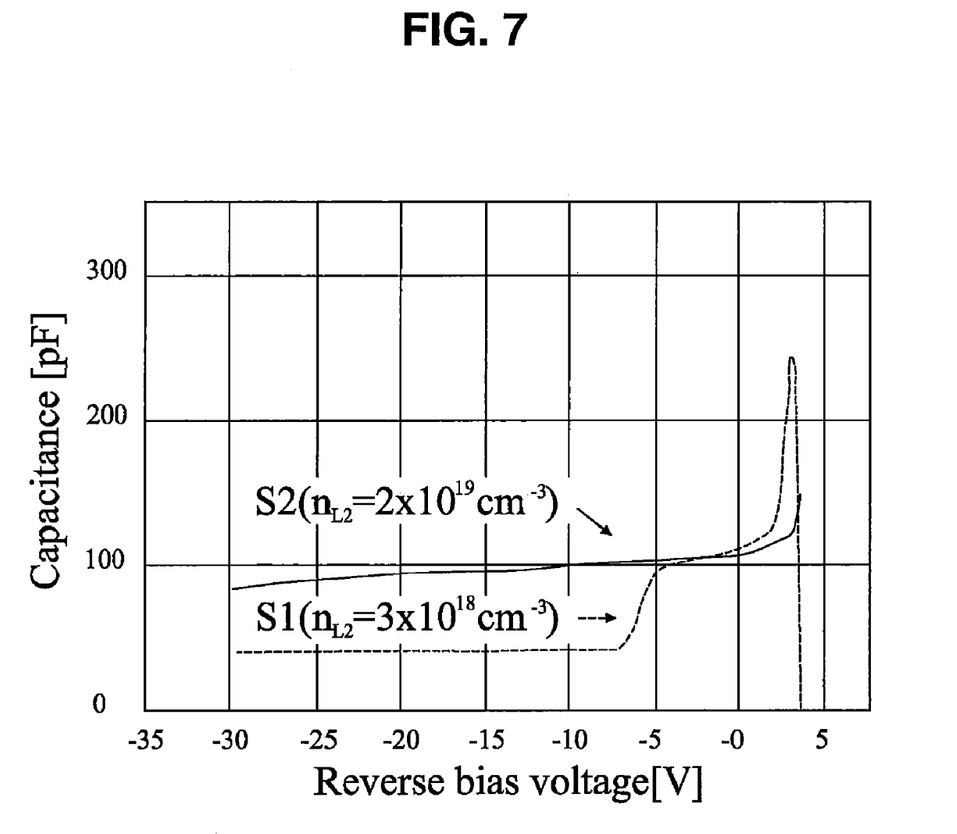
FIG. 7 is a graph of properties of the two samples on C-V coordinates according to the present invention.

FIG. 7 is a graph of properties of the two samples on capacitance-voltage (C-V) coordinates according to the present disclosure. In the case of the GaN layer 32a, the capacitance is suddenly dropped between about 5 V and 7 V of reverse bias, but in the case of the GaN layer 32b, the capacitance is seldom changed up to about 30 V of reverse bias. Such a change in the capacitance is closely associated with the thickness of a depletion layer (depletion width). When the reverse voltage is applied, since the activated acceptor concentration (>$1\times10^{19-3}$) in the p-type III-nitride semiconductor layer 50 is much higher than the activated donor concentration in the n-type III-nitride semiconductor layer 30, the depletion layer expands from the GaN layers 32a and 32b to the undoped GaN layer 31. When the C-V measurement result is analyzed based on this, in the case of the GaN layer 32a, the depletion layer expands into the undoped GaN layer 31 via the GaN layer 32a between 5 V and 7 V of reverse bias, and in the case of the GaN layer 32b, even if the reverse bias up to 30 V is applied, the depletion layer does not expand into the undoped GaN layer 32a but confines itself in the GaN layer 32b. In this regard, the GaN layer 32b may be deemed as a depletion barrier layer.

As the internal capacitance Ci increases, the depletion barrier layer becomes unsusceptible to the ESD. For this purpose, the depletion barrier layer preferably has a doping concentration of $1\times10^{19-3}$ to $5\times10^{20-3}$. If the doping concentration is lower than $1\times10^{19-3}$, the improvement of the ESD property is not expected, and if the doping concentration is higher than $5\times10^{20-3}$, a depletion barrier layer to be grown is excessively doped, which may lead to a growth defect. Moreover, the depletion barrier layer preferably has a thickness of 40 Å to 500 Å. If the thickness is smaller than 40 Å, the resulting layer may not normally function as the depletion barrier layer, and if the thickness is greater than 500 Å, the resulting layer may have a detrimental effect on reliability of the light-emitting device. Si is mostly used as the n-type dopant for the depletion barrier layer, but Ge or other element may be used. A GaN layer, which can easily maintain the crystalline property in the event of high-concentration doping, is preferably used as the depletion barrier layer, but an InGaN layer or an AlGaN layer may be used.

Meanwhile, since the internal capacitance Ci is inversely proportional to the thickness of the depletion barrier layer, the distance between the p-type III-nitride semiconductor layer 50 and the depletion barrier layer preferably ranges from 50 nm to 300 nm. When reverse bias enters, the depletion barrier layer has almost the same thickness as the active layer 40. If the distance is smaller than 50 nm, the internal quantum efficiency of the active layer 40 may be degraded due to a defect which may be caused by the depletion barrier layer doped at a high concentration. If the distance is greater than 300 nm, the active layer 40 can have high internal quantum efficiency, overcoming the defect which may be caused by the depletion barrier layer. However, since an absolute capacitance value is too small, it is not easy to implement a device unsusceptible to the ESD.

Figure 8:
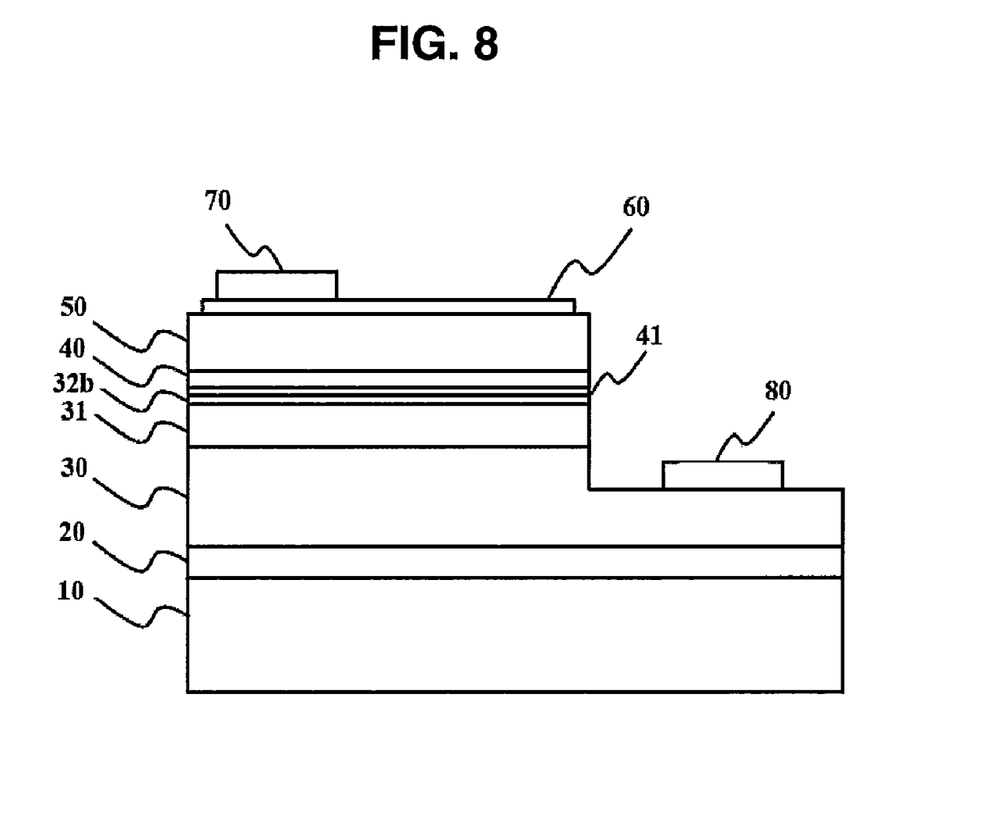
FIG. 8 is a cross-sectional view showing a preferred embodiment of a III-nitride semiconductor light-emitting device constructed in accordance with the teachings of the present invention.

FIG. 8 is a view of a preferred embodiment of a III-nitride semiconductor light-emitting device according to the present disclosure. Fundamentally, the III-nitride semiconductor light-emitting device has the same configuration as the light-emitting device shown in FIG. 4. However, the III-nitride semiconductor light-emitting device includes an InxGa1−xN layer 41 as the bottommost layer of an active layer 40. The InxGa1−xN layer 41 serves to certainly protect the active layer 40 from a depletion barrier layer 32b doped at a high concentration. For example, the InxGa1−xN layer 41 may be made of In0.02Ga0.98N with a thickness of 500 Å. The InxGa1−xN layer 41 is preferably undoped to ensure the protection of the active layer 40 and preferably has a thickness of 300 Å to 0.15. If the InxGa1−xN layer 41 is too thin, it does not normally operate, and if the InxGa1−xN layer 41 is too thick, internal capacitance Ci decreases. With respect to the composition of Indium (In), x is preferably equal to or smaller than 0.04. If x is greater than 0.04, indium fluctuation occurs, causing many other defects. In the meantime, In serves to reinforce the lateral growth mode to remove defects, so that x is more preferably greater than 0. Description of same reference numerals will be omitted.

Hereinafter, a variety of aspects of the disclosure are explained.

(1) A III-nitride semiconductor light-emitting device wherein the depletion barrier layer has a doping concentration equal to or greater than $1\times10^{19-3}$.

(2) A III-nitride semiconductor light-emitting device wherein the depletion barrier layer has a doping concentration of $1\times10^{19-3}$ to $5\times10^{20-3}$.

(3) A III-nitride semiconductor light-emitting device wherein the depletion barrier layer has a thickness of 40 Å to 500 Å.

(4) A III-nitride semiconductor light-emitting device wherein the distance between the depletion barrier layer and the second III-nitride semiconductor layer ranges from 50 nm to 300 nm.

(5) A III-nitride semiconductor light-emitting device wherein the depletion barrier layer is made of GaN.

(6) A III-nitride semiconductor light-emitting device further comprising a third undoped III-nitride semiconductor layer disposed between the depletion barrier layer and the first III-nitride semiconductor layer.

(7) A III-nitride semiconductor light-emitting device wherein the third III-nitride semiconductor layer is made of GaN.

(8) A III-nitride semiconductor light-emitting device wherein the active layer comprises an InxGa1−xN layer on the contact side with the depletion barrier layer.

(9) A III-nitride semiconductor light-emitting device wherein x is equal to or smaller than 0.04.

(10) A III-nitride semiconductor light-emitting device wherein x is greater than 0.

(11) A III-nitride semiconductor light-emitting device wherein the InxGa1−xN layer is undoped.

(12) A III-nitride semiconductor light-emitting device wherein the InxGa1−xN layer has a thickness of 300 Å to 0.15.

(13) A III-nitride semiconductor light-emitting device wherein the third III-nitride semiconductor layer has a thickness of 0.1 to 0.3.

According to one III-nitride semiconductor light-emitting device of the present disclosure, it can be protected from an external electric shock (e.g., ESD).

According to another III-nitride semiconductor light-emitting device of the present disclosure, a structure for protecting a light-emitting device from an external shock can be implemented in the light-emitting device.

According to a further III-nitride semiconductor light-emitting device of the present disclosure, it can be protected from the ESD by implementing a capacitor using an active layer as a depletion layer.

According to a still further III-nitride semiconductor light-emitting device of the present disclosure, the light-emitting device can be protected from an external shock by introducing a III-nitride semiconductor layer doped at a high concentration under an active layer.

According to a still further III-nitride semiconductor light-emitting device of the present disclosure, although a III-nitride semiconductor layer doped at a high concentration is introduced under an active layer, an InxGa1−xN layer can be provided to maintain an electrical property of the active layer.

Thus, there has been shown and described several embodiments of a novel invention. As is evident from the foregoing description, certain aspects of the present invention are not limited by the particular details of the examples illustrated herein, and it is therefore contemplated that other modifications and applications, or equivalents thereof, will occur to those skilled in the art. The terms "having" and "including" and similar terms as used in the foregoing specification are used in the sense of "optional" or "may include" and not as "required". Many changes, modifications, variations and other uses and applications of the present invention will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A III-nitride semiconductor light-emitting device, comprising:
    a first III-nitride semiconductor layer of a first conductivity type;
    a second III-nitride semiconductor layer of a second conductivity type wherein the second conductivity type is different from the first conductivity type;
    an active layer disposed between the first III-nitride semiconductor layer and the second III-nitride semiconductor layer, the active layer generating light by recombination of electrons and holes; and
    a depletion barrier layer brought into contact with the active layer, the depletion barrier layer being of the first conductivity type, wherein the depletion barrier layer has a doping concentration of $1 \times 10^{19}$ cm$^{-3}$ to $5 \times 10^{20}$ cm$^{-3}$, and wherein the distance between the depletion barrier layer and the second III-nitride semiconductor layer ranges from 50 nm to 300 nm.

2. The III-nitride semiconductor light-emitting device of claim 1, wherein the depletion barrier layer has a thickness of 40 Å to 500 Å.

3. The III-nitride semiconductor light-emitting device of claim 1, wherein the depletion barrier layer is made of GaN.

4. The III-nitride semiconductor light-emitting device of claim 1, further comprising a third undoped III-nitride semiconductor layer disposed between the depletion barrier layer and the first III-nitride semiconductor layer.

5. The III-nitride semiconductor light-emitting device of claim 4, wherein the third III-nitride semiconductor layer is made of GaN.

6. The III-nitride semiconductor light-emitting device of claim 1, wherein the active layer comprises an $In_xGa_{1-x}N$ layer on the contact side with the depletion barrier layer.

7. The III-nitride semiconductor light-emitting device of claim 6, wherein x is equal to or smaller than 0.04.

8. The III-nitride semiconductor light-emitting device of claim 7, wherein x is greater than 0.

9. The III-nitride semiconductor light-emitting device of claim 8, wherein the $In_xGa_{1-x}N$ layer is undoped.

10. The III-nitride semiconductor light-emitting device of claim 9, wherein the $In_xGa_{1-x}N$ layer has a thickness of 300 Å to 0.15 µm.

11. The III-nitride semiconductor light-emitting device of claim 10, wherein the depletion barrier layer is made of GaN with a thickness of 40 Å to 500 Å.

12. The III-nitride semiconductor light-emitting device of claim 11, comprising an undoped GaN layer disposed between the depletion barrier layer and the first III-nitride semiconductor layer.

13. The III-nitride semiconductor light-emitting device of claim 12, wherein the undoped GaN layer has a thickness of 0.1 µm to 0.3 µm.

* * * * *